United States Patent
Chew

(10) Patent No.: US 10,504,850 B2
(45) Date of Patent: Dec. 10, 2019

(54) SEMICONDUCTOR PROCESSING METHOD

(71) Applicant: PEP INNOVATION PTE LTD, Singapore (SG)

(72) Inventor: Yi Xin Chew, Singapore (SG)

(73) Assignee: PEP INNOVATION PTE LTD, Singapore (SG)

( * ) Notice: Subject to any disclaimer, the term of this patent is extended or adjusted under 35 U.S.C. 154(b) by 0 days.

(21) Appl. No.: 15/752,728

(22) PCT Filed: Aug. 12, 2016

(86) PCT No.: PCT/SG2016/050385
§ 371 (c)(1),
(2) Date: Feb. 14, 2018

(87) PCT Pub. No.: WO2017/030501
PCT Pub. Date: Feb. 23, 2017

(65) Prior Publication Data
US 2018/0233455 A1    Aug. 16, 2018

(30) Foreign Application Priority Data

Aug. 14, 2015  (SG) ............... 10201506419V
Nov. 6, 2015  (SG) ............... 10201509217Q

(51) Int. Cl.
*H01L 23/544*   (2006.01)
*H01L 23/31*    (2006.01)
(Continued)

(52) U.S. Cl.
CPC ........ *H01L 23/544* (2013.01); *H01L 21/6835* (2013.01); *H01L 23/3121* (2013.01);
(Continued)

(58) Field of Classification Search
CPC ... H01L 23/544; H01L 24/97; H01L 21/6835; H01L 23/3121; H01L 23/32;
(Continued)

(56) References Cited

U.S. PATENT DOCUMENTS 5,366,573 A   11/1994 Bayer et al.
6,278,193 B1   8/2001 Coico et al.
(Continued)

FOREIGN PATENT DOCUMENTS

TW    201442179 A1   11/2014

OTHER PUBLICATIONS

International Search Report and Written Opinion dated Nov. 16, 2016 for PCT/SG2016/050385 Filed Aug. 12, 2016. pp. 1-11.
(Continued)

*Primary Examiner* — Ismail A Muse
(74) *Attorney, Agent, or Firm* — Dinsmore & Shohl, LLP

(57) ABSTRACT

A semiconductor processing method is provided. The method includes providing a first carrier (10). A first adhesive (18) is provided on the first carrier (10) and a plurality of semiconductor chips (20) is placed on the first adhesive (18). A second carrier (28) is provided. The second carrier (28) is provided with a plurality of chip receiving areas (32). The first and second carriers (10) and (28) are then brought together to attach the semiconductor chips (20) to respective ones of the chip receiving areas (32) on the second carrier (28). The first carrier (10) is then separated from the semiconductor chips (20).

69 Claims, 21 Drawing Sheets

(51) Int. Cl.
*H01L 23/32* (2006.01)
*H01L 21/683* (2006.01)
*H01L 23/00* (2006.01)

(52) U.S. Cl.
CPC .............. *H01L 23/32* (2013.01); *H01L 24/00* (2013.01); *H01L 24/97* (2013.01); *H01L 2221/68372* (2013.01); *H01L 2221/68381* (2013.01); *H01L 2223/5442* (2013.01); *H01L 2223/54426* (2013.01); *H01L 2224/04105* (2013.01); *H01L 2224/19* (2013.01); *H01L 2224/24195* (2013.01); *H01L 2224/32245* (2013.01); *H01L 2224/73267* (2013.01); *H01L 2224/92244* (2013.01); *H01L 2224/97* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ....... H01L 2224/19; H01L 2924/19043; H01L 2224/04105; H01L 2924/19042; H01L 2924/19105; H01L 2224/32245; H01L 2224/24195; H01L 2924/19041; H01L 2224/97; H01L 2224/92244; H01L 2224/73267; H01L 2221/68372; H01L 2223/5442; H01L 2221/68381; H01L 2223/54426
See application file for complete search history.

(56) References Cited

U.S. PATENT DOCUMENTS

| | | |
|---|---|---|
| 6,617,702 B2 | 9/2003 | Hsu et al. |
| 2002/0140063 A1 | 10/2002 | Yamazaki et al. |
| 2004/0057621 A1* | 3/2004 | Lee .................. G06K 9/4604 382/215 |
| 2006/0183269 A1 | 8/2006 | Fuergut et al. |
| 2006/0279687 A1* | 12/2006 | Park .................. G02F 1/1333 349/142 |
| 2012/0153462 A1* | 6/2012 | Wakiyama ........... H01L 21/563 257/737 |
| 2013/0140713 A1* | 6/2013 | Yu .................. H01L 23/544 257/782 |
| 2014/0154842 A1 | 6/2014 | Chang et al. |
| 2014/0231989 A1* | 8/2014 | Pagaila ................ H01L 21/568 257/737 |
| 2015/0219448 A1* | 8/2015 | Tseng .................. H01L 22/10 356/401 |
| 2016/0379915 A1* | 12/2016 | Lee .................. H01L 23/49811 257/737 |

OTHER PUBLICATIONS

"Step 10: Encapsulation Materials, Processes and Equipment" http://web.archive.org/web/20140116215835/http://electroiq.com/blog/2004/10/step-1 Accessed: Nov. 2016.

* cited by examiner

SEMICONDUCTOR PROCESSING METHOD

FIELD OF THE INVENTION

The present invention relates to semiconductor packaging and more particularly to a semiconductor processing method.

BACKGROUND OF THE INVENTION

Manufacturability is an important consideration in semiconductor packaging as it has a direct effect on packaging cost. Accordingly, to reduce packaging cost, it would be desirable to have a substrate that facilitates the semiconductor packaging process.

SUMMARY OF THE INVENTION

Accordingly, in a first aspect, the present invention provides a semiconductor processing method. The method includes providing a first carrier. A first adhesive is provided on the first carrier and a plurality of semiconductor chips is placed on the first adhesive. A second carrier is provided. The second carrier is provided with a plurality of chip receiving areas. The first and second carriers are then brought together to attach the semiconductor chips to respective ones of the chip receiving areas on the second carrier. The first carrier is then separated from the semiconductor chips.

Other aspects and advantages of the invention will become apparent from the following detailed description, taken in conjunction with the accompanying drawings, illustrating by way of example the principles of the invention.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
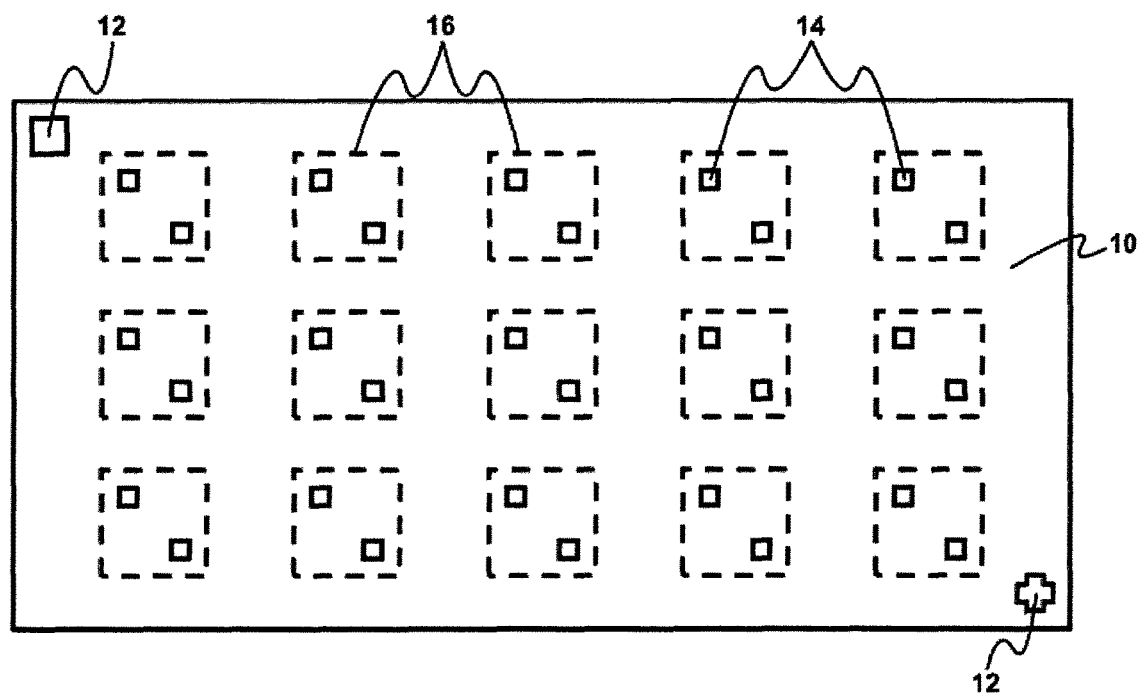
FIG. 1 is a schematic top plan view of a first carrier in accordance with an embodiment of the present invention.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the scope of the invention. In the drawings, like numerals are used to indicate like elements throughout.

FIGS. 1 through 22 illustrate a semiconductor processing method in accordance with embodiments of the present invention. Throughout this specification, the term "global mark" is used to describe a position indicator at a carrier or primary level, the term "unit mark" is used to describe a position indicator at a unit level, the term "chip mark" is used to describe a position indicator on a semiconductor chip, and the term "secondary global mark" is used to describe a position indicator at a multi-carrier or secondary level.

Referring now to FIG. 1, a first or transfer carrier 10 is provided. In the present embodiment, the first carrier 10 is provided with a plurality of first global marks 12. In the embodiment shown, the first carrier 10 is also provided with a plurality of first unit marks 14, the first unit marks 14 defining a plurality of chip placement positions 16.

The first carrier 10 may be provided in strip or panel form and may be made of a metal such as, for example, steel or copper, a metal alloy, glass or a polymer such as, for example, FR4. In an embodiment where the first carrier 10 is made of a metallic material, the first global marks 12 and the first unit marks 14 may be formed in or on the first carrier 10 by chemical etching, laser etching or electroplating using conventional photolithography or pattern formation processes. In the case of etching, the first global marks 12 and the first unit marks 14 may be engraved into a surface of the first carrier 10. In the case of electroplating, the metallic first carrier 10 may be used as a conductive plane with the deposited first global marks 12 and first unit marks 14 formed on and protruding from a surface of the first carrier 10. In an embodiment where the first carrier 10 is made of glass or a polymer, the first global marks 12 and the first unit marks 14 may be engraved into the first carrier 10 by laser or ink engraving. Advantageously, when the first carrier 10 is made of glass, processing precision may be improved as glass has a low coefficient of thermal expansion and therefore when the first carrier 10 is heated during subsequent processing steps, the first global marks 12 and the first unit marks 14 formed in the first carrier 10 do not move significantly. Furthermore, because the first global marks 12 and the first unit marks 14 are created directly on the first carrier 10, no additional processing steps that may introduce an offset or other error are involved. This also helps improve processing precision.

In the embodiment shown, each of the first global marks 12 has a different shape. Advantageously, this helps with locating a position of the first carrier 10 and positioning of other elements or components relative to the first carrier 10 during the semiconductor processing method.

Although two (2) global marks 12 are illustrated as being provided on the surface of the first carrier 10 and two (2) unit marks 14 are illustrated as being provided to define each of the chip placement positions 16 in the embodiment shown, it should be understood by those of ordinary skill in the art that the present invention is not limited by the number of first global marks 12 or first unit marks 14 provided. The first carrier 10 may be provided with a greater number of the first global marks 12 and/or the first unit marks 14 in alternative embodiments.

In the present embodiment, a position of the first unit marks 14 may be determined based on a position of the first global marks 12. Each of the first global marks 12 may be provided at a fixed or selected position relative to the other first global mark 12 and each of the first unit marks 14 may be provided at a fixed or selected position relative to the first global marks 12 and the other first unit mark 14 within the same chip placement position 16. The first global marks 12 may be used to calculate and determine the positions of the first unit marks 14 and the first unit marks 14 may be used to calculate and determine a center of each of the chip placement positions 16, each of the chip placement positions 16 corresponding to a unit position where a semiconductor chip is to be mounted. In such an embodiment, the centers of the chip placement positions 16 are at a fixed or selected position relative to the first global marks 12.

Figure 2:
FIG. 2 is a schematic side view of the first carrier of FIG. 1 with a first adhesive provided thereon.

Referring now to FIG. 2, a first adhesive 18 is provided on the first or transfer carrier 10 as shown. The first adhesive 18 may be disposed on the first or transfer carrier 10 by lamination or by screen printing or coating.

In the present embodiment, the first adhesive 18 includes a releasable adhesive material that has a release mechanism that causes the releasable adhesive material to lose substantial adhesive strength, for example, on exposure to heat, ultraviolet or infrared radiation, or a chemical solution. In one embodiment, the first adhesive 18 may be a heat-release film whose adhesive strength decreases substantially upon exposure to heat.

In the embodiment shown, the first global marks 12 and the first unit marks 14 are engraved into the first carrier 10 and do not therefore extend beyond the surface of the first carrier 10. In such an embodiment, the first adhesive 18 may be transparent or translucent so that the first global marks 12 and the first unit marks 14 are visible though the first adhesive 18.

Figure 3:
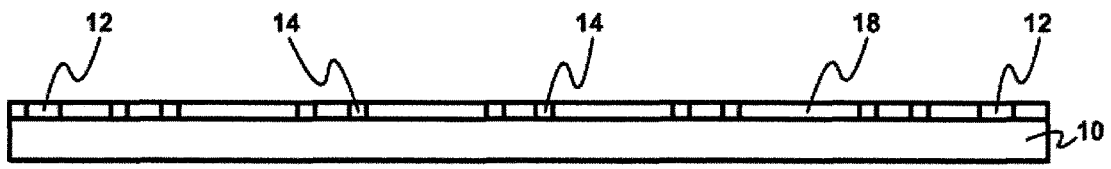
FIG. 3 is a schematic side view of the first carrier of FIG. 1 with a first adhesive provided thereon in accordance with another embodiment of the present invention.

Referring now to FIG. 3, an alternative embodiment of the first carrier 10 with the first adhesive 18 provided thereon is shown. In the embodiment shown, the first global marks 12 and the first unit marks 14 are formed on the surface of the first carrier 10 and protrude from the surface of the first carrier 10. In such an embodiment, the first adhesive 18 encapsulates the first global marks 12 and the first unit marks 14 such that only top surfaces of the first global marks 12 and the first unit marks 14 are exposed. In this embodiment, the first adhesive 18 may be opaque.

Figure 4:
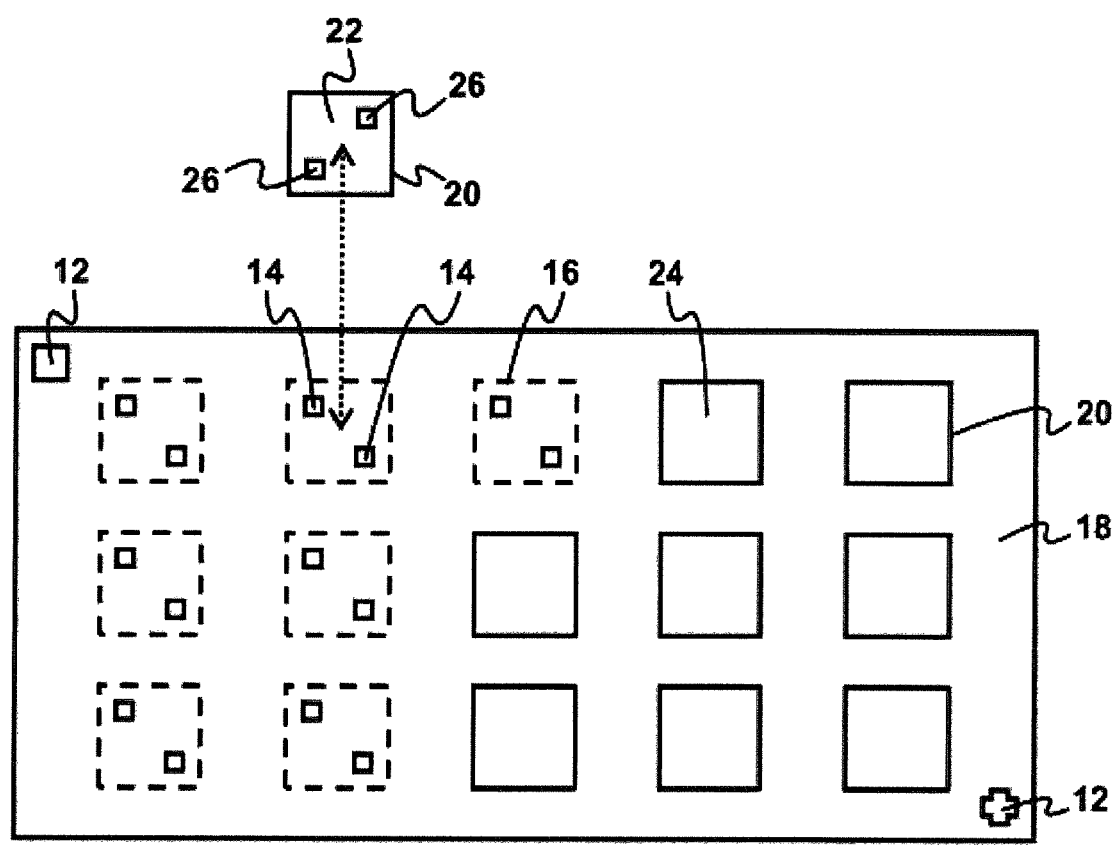
FIG. 4 is a schematic diagram illustrating placement of a plurality of semiconductor chips on the first adhesive of FIG. 2 or FIG. 3.

Referring now to FIG. 4, a plurality of semiconductor chips 20 is placed on the first adhesive 18 of FIG. 2 or FIG. 3 as shown.

Each of the semiconductor chips 20 may be a processor, such as a digital signal processor (DSP), a special function circuit, such as a memory address generator, or perform any other type of function. Moreover, the semiconductor chips 20 are not limited to a particularly technology such as CMOS, or derived from any particular wafer technology. Further, the present invention can accommodate various chip sizes, as will be understood by those of skill in the art. Each of the semiconductor chips 20 has an active surface 22 and a dummy surface 24 on an opposite surface to the active surface 22. Terminal pads (not shown) for electrical connection to the chip circuitry are provided on the active surface 22 of the semiconductor chips 20.

A plurality of chip marks 26 are provided on each of the semiconductor chips 20 in the present embodiment, the chip marks 26 being provided on the active surface 22 of the semiconductor chips 20. Each of the chip marks 26 may be provided at a fixed or specified position relative to other ones of the chip marks 26 and/or the terminal pads and may be used to calculate and determine a center of respective ones of the semiconductor chips 20. In one embodiment, distinctive features on the semiconductor chips 20 may serve or function as the chip marks 26.

In the present embodiment as shown, the chip marks 26 on each of the semiconductor chips 20 are aligned with corresponding ones of the first unit marks 14 before placing respective ones of the semiconductor chips 20 on the first adhesive 18. In this manner, the center of each of the semiconductor chips 20 is aligned with the center of each corresponding unit or chip placement position 16 and each of the semiconductor chips 20 is aligned with the corresponding unit or chip placement position 16 when respective ones of the semiconductor chips 20 are placed on the first or transfer carrier 10. Consequently, the center and hence position of each of the semiconductor chips 20 is also at a fixed or specified position relative to the first or global marks 12. The alignment may be performed by a vision system including a camera unit and a controller unit that calculates and adjusts the positions of the semiconductor chips 20.

When placed on the first or transfer carrier 10, the active surface 22 of the semiconductor chips 20 faces the first or transfer carrier 10 and adheres to the first adhesive 18. The first adhesive 18 helps prevent any unnecessary displacement of the semiconductor chips 20 during subsequent processing steps and also helps ensure that each of the semiconductor chips 20 is always at a fixed or specified position relative to the first global marks 12.

In an embodiment where the first adhesive 18 is in a paste form, a semi-solid form or a b-stage form, the first adhesive 18 may be further cured by heat or radiation to increase its material modulus and adhesion to the semiconductor chips 20.

Figure 5:
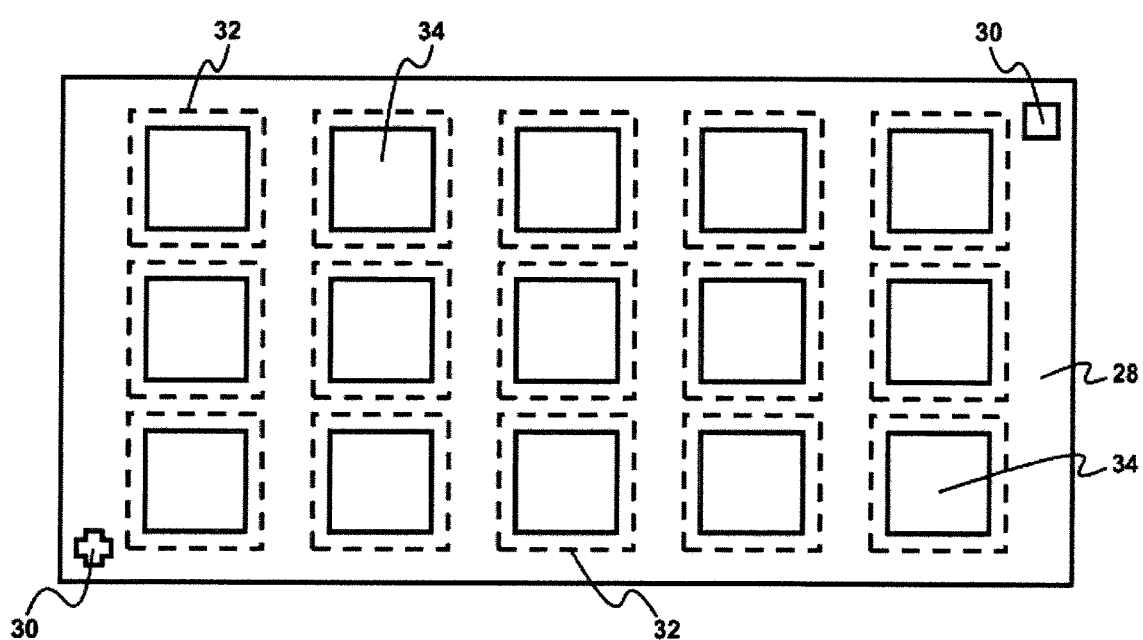
FIG. 5 is a schematic top plan view of a second carrier in accordance with an embodiment of the present invention.

Referring now to FIG. 5, a second or support carrier 28 is provided, the second carrier 28 being provided with a plurality of chip receiving areas 32. In the present embodiment, the second carrier 28 is also provided with a plurality of second global marks 30. In the present embodiment, the chip receiving areas 32 include a plurality of chip pads 34 provided on the second carrier 28, each of the chip pads 34 corresponding to a chip receiving area or unit area 32 where one of the semiconductor chips 20 is to be mounted or attached.

The second carrier 28 may be provided in strip or panel form. In one embodiment, the second carrier 28 is formed of an electrically conductive and chemically etchable material such as, for example, copper or steel, or layers thereof. In another embodiment, the second carrier 28 may be a polymer resin insulation sheet laminated with a layer of an electrically conductive and chemically etchable material such as, for example, copper.

In the embodiment shown, each of the second global marks 30 has a same shape as a corresponding one of the first global marks 12. Advantageously, this helps with the positioning of the second carrier 28 relative to the first carrier 10 during subsequent processing steps.

Although two (2) global marks 30 are illustrated as being provided on a surface of the second carrier 28 in the embodiment shown, it should be understood by those of ordinary skill in the art that the present invention is not limited by the number of second global marks 30 provided. For example, the second carrier 28 may be provided with a greater number of the second global marks 30 in alternative embodiments.

In the present embodiment, each of the second global marks 30 is provided at a fixed or selected position relative to the other second global mark 30 and each of the chip pads 34 is provided at a fixed or selected position relative to the second global marks 30 and also the other chip pads 34. The second global marks 30 may be used to calculate and determine the positions of the chip receiving areas 32 and consequently the chip pads 34 as well. In a preferred embodiment, a center of each of the chip pads 34 corresponds to a center of a corresponding one of the chip receiving areas 32.

The chip pads 34 may be formed by electroplating using standard photolithography and pattern formation processes and the chip pads 34 thus formed protrude from a surface of the second carrier 28. In a preferred embodiment, the second global marks 30 may be formed together with the chip pads 34 by electroplating and thus also protrude from the surface of the second carrier 28. In an alternative embodiment, the second global marks 30 may first be formed by chemical etching or engraving using laser or ink before forming the chip pads 34.

Figure 6:
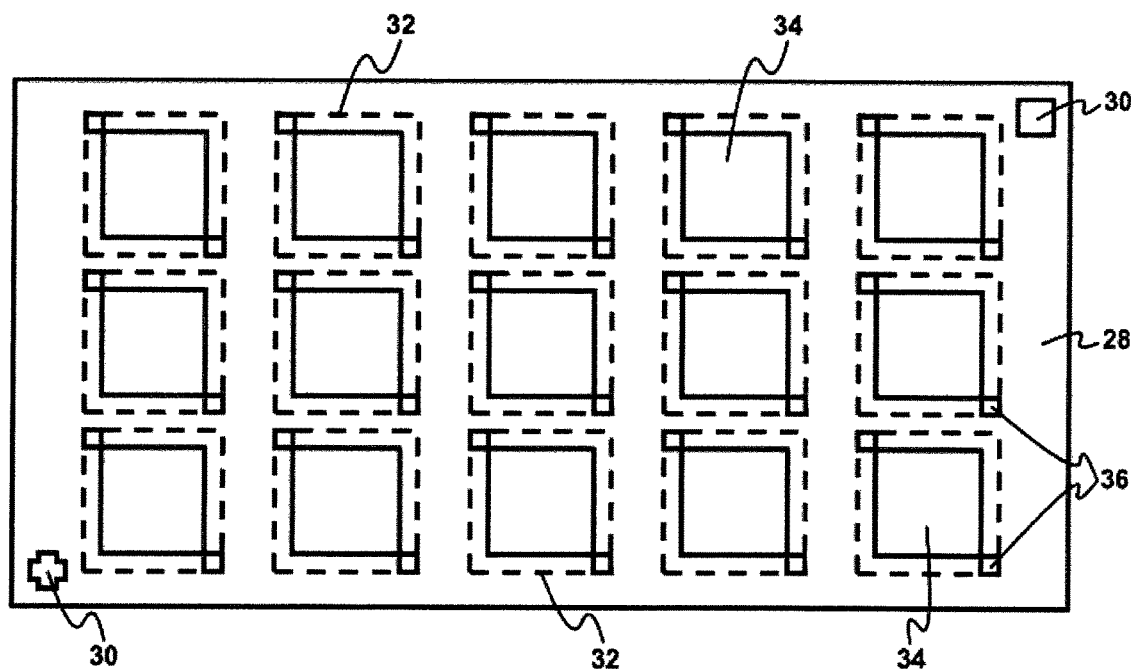
FIG. 6 is a schematic top plan view of a second carrier in accordance with another embodiment of the present invention.

Referring now to FIG. 6, an alternative embodiment of the second carrier 28 is shown. In the embodiment shown, a plurality of second unit marks 36 is formed on a surface of the second carrier 28 adjacent respective ones of the chip pads 34.

In the present embodiment, the second unit marks 36 are provided in the chip receiving areas 32 with pairs of the second unit marks 36 defining corresponding ones of the chip receiving areas 32. Although two (2) unit marks 36 are illustrated as being provided to define each of the chip receiving areas 32 in the embodiment shown, it should be understood by those of ordinary skill in the art that the present invention is not limited by the number of second unit marks 36 provided. For example, a greater number of second unit marks 36 may be provided to define each of the chip receiving areas 32 in alternative embodiments.

A position of the second unit marks 36 may be determined based on a position of the second global marks 30 in the present embodiment. Each of the second unit marks 36 may be provided at a fixed or selected position relative to the second global marks 30 and also relative to the chip pad 34 and the other second unit mark 36 within the same chip receiving area 32. The second global marks 30 may be used to calculate and determine the positions of the second unit marks 36 and the second unit marks 36 may be used to calculate and determine a center of the chip receiving areas 32 and the chip pads 34 such that the centers of the chip receiving areas 32 and the chip pads 34 are also at a fixed or selected position relative to the second global marks 30.

Figure 7:
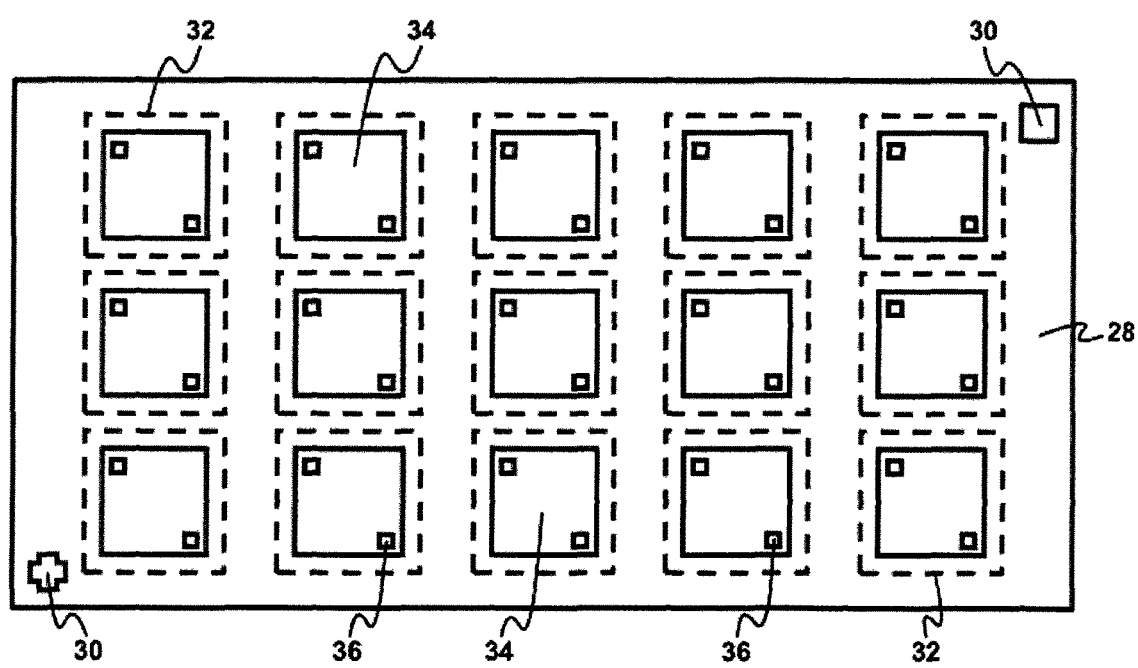
FIG. 7 is a schematic top plan view of a second carrier in accordance with yet another embodiment of the present invention.

Referring now to FIG. 7, yet another embodiment of the second carrier 28 is shown. In this embodiment, the second unit marks 36 are formed on the chip pads 34 themselves.

Figure 8:
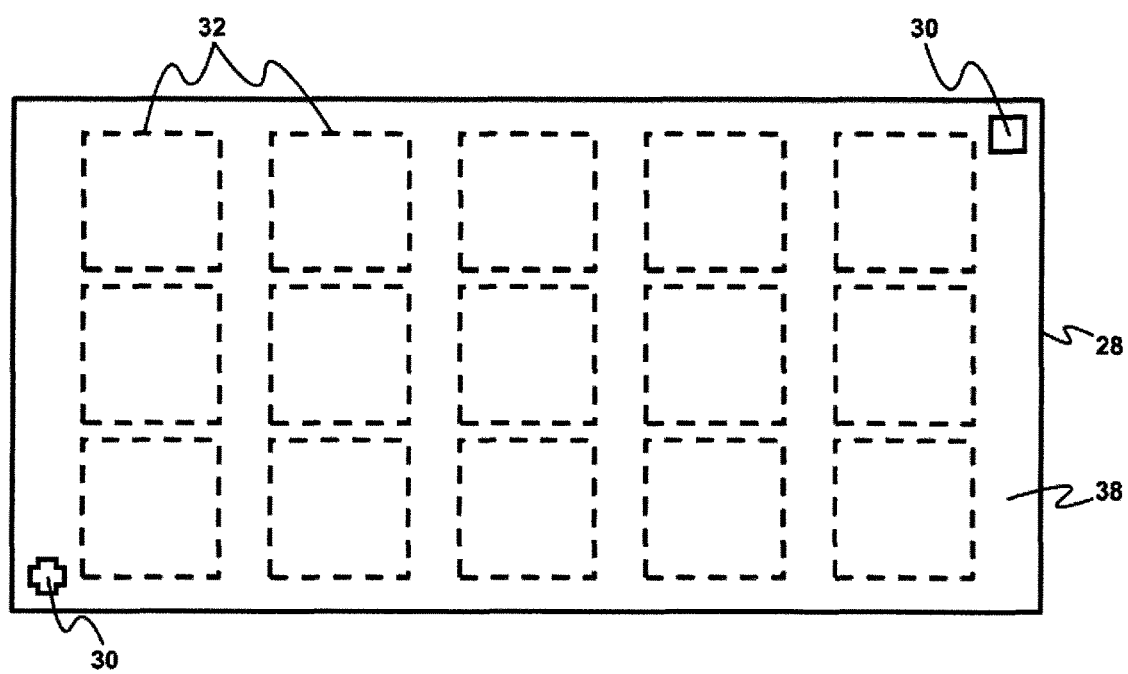
FIG. 8 is a schematic top plan view of a second carrier in accordance with still another embodiment of the present invention.

Referring now to FIG. 8, still another embodiment of the second carrier 28 is shown. In this embodiment, individual chip pads 34 are not formed and the second carrier 28 includes a layer of metal 38 such as, for example, copper or nickel, disposed on a surface of the second carrier 28 by cladding or electroplating. In such an embodiment, the second global marks 30 may be formed on the second carrier 28 by electroplating and thus protrude from the surface. The second global marks 30 may also be formed on the second carrier 28 by chemical etching or engraving using laser or ink.

Figure 9:
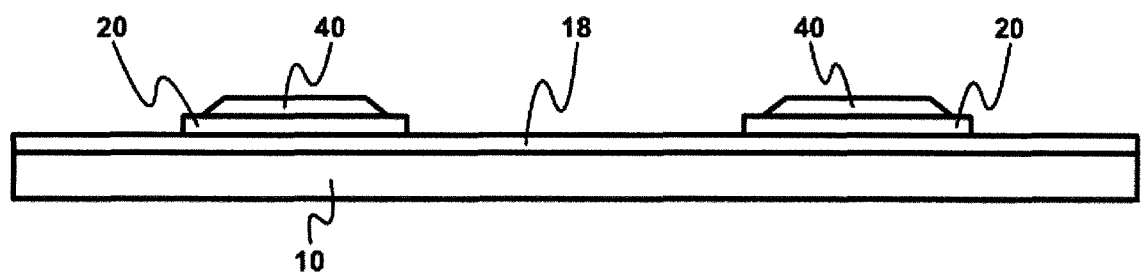
FIG. 9 is a schematic side view showing a second adhesive disposed on each of the semiconductor chips on the first carrier in accordance with an embodiment of the present invention.

Referring now to FIG. 9, a second adhesive 40 is disposed on each of the semiconductor chips 20 on the first carrier 10 as shown. More particularly, a bonding layer 40 is disposed on the dummy surfaces 24 of the semiconductor chips 20 on the first carrier 10 in the embodiment shown. This may be by stencil screen printing or needle or jet dispensing. The second adhesive 40 may be an epoxy-based chip attach adhesive, an acrylic-based chip attach adhesive or a thermal interface material such as, for example, silver paste. In an alternative embodiment, the second adhesive 40 may be pre-formed on the semiconductor chips 20 prior to singulation such as, for example, in the form of a die-attach film. Advantageously, when the second adhesive 40 is disposed on the semiconductor chips 20 on the first carrier 10, the second carrier 28 may be pre-heated and ramped up to a selected temperature more quickly.

Figure 10:
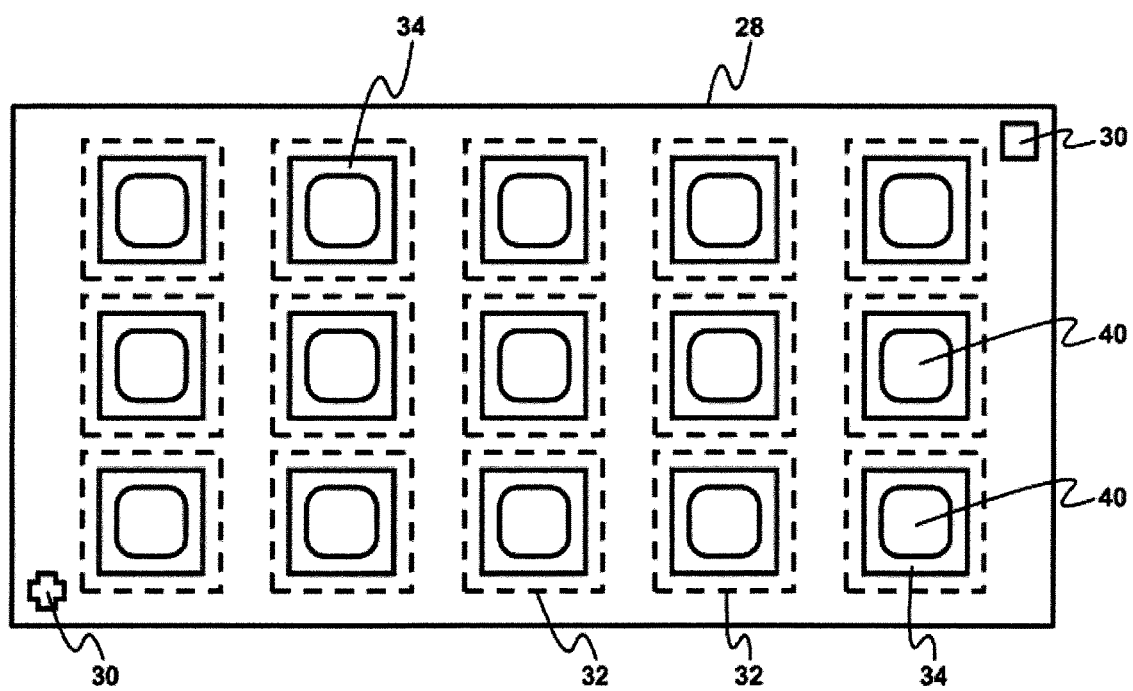
FIG. 10 is a schematic side view showing a second adhesive disposed on each of the chip receiving areas of the second carrier in accordance with another embodiment of the present invention.

Referring now to FIG. 10, an alternative embodiment in which the adhesive or bonding layer 40 is instead disposed on each of the chip receiving areas 32 of the second carrier 28 is shown.

Figure 11:
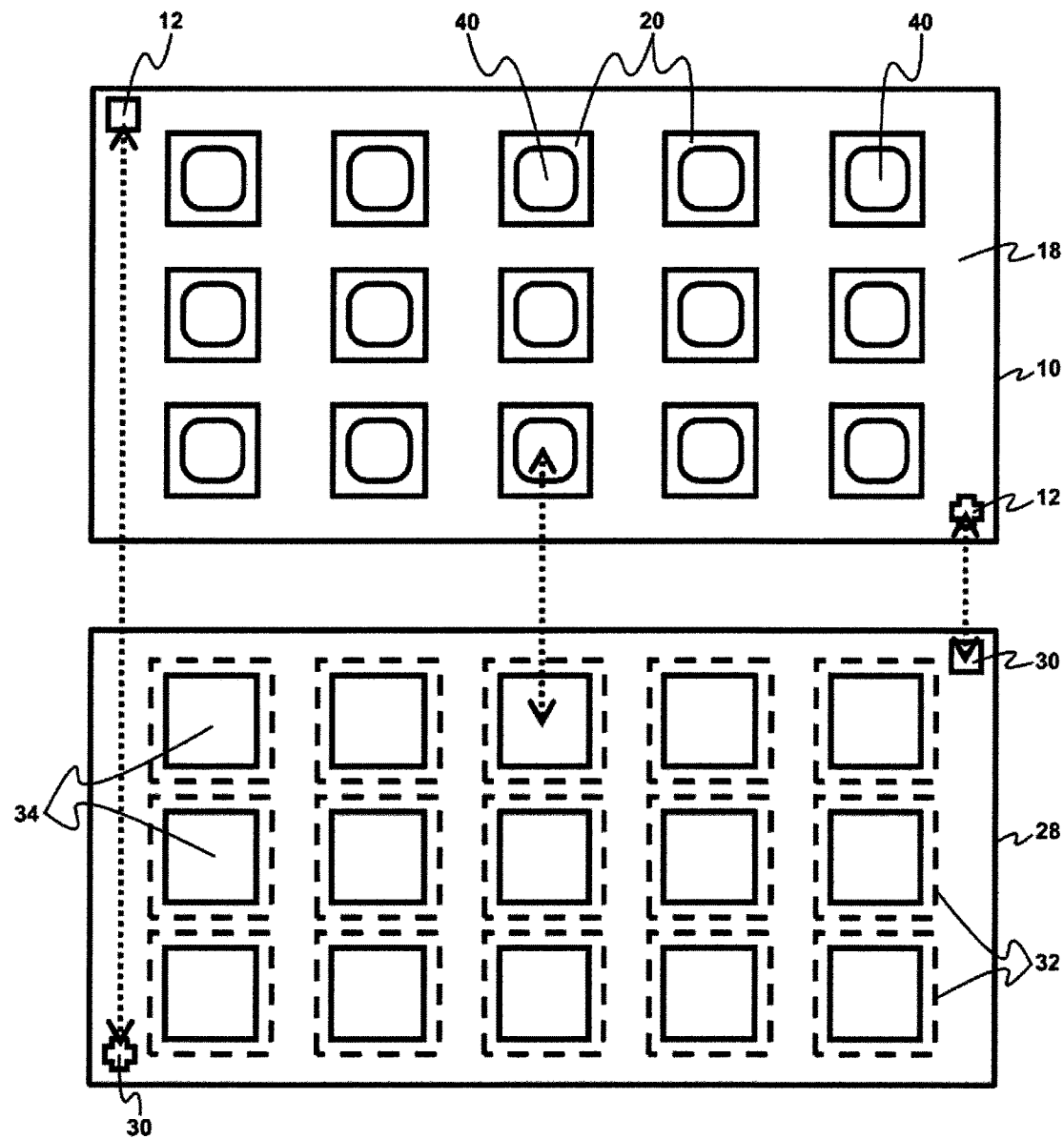
FIG. 11 is a schematic diagram illustrating alignment of a plurality of first global marks of the first carrier with corresponding ones of a plurality of second global marks of the second carrier in accordance with an embodiment of the present invention.

Referring now to FIG. 11, the first global marks 12 of the first carrier 10 are aligned with corresponding ones of the second global marks 30 of the second carrier 28 in the present embodiment as shown. In this manner, the transfer carrier 10 is aligned with the support carrier 28 and the semiconductor chips 20 on the transfer carrier 10 are substantially aligned with the corresponding chip pads 34 on the support carrier 28. When the transfer carrier 20 and the support carrier 28 are positioned in this manner, the semiconductor chips 20 and the corresponding chip pads 34 face towards each other and the center of each of the semiconductor chips 20 is substantially aligned with the center of each of the corresponding chip pads 34.

Figure 12:
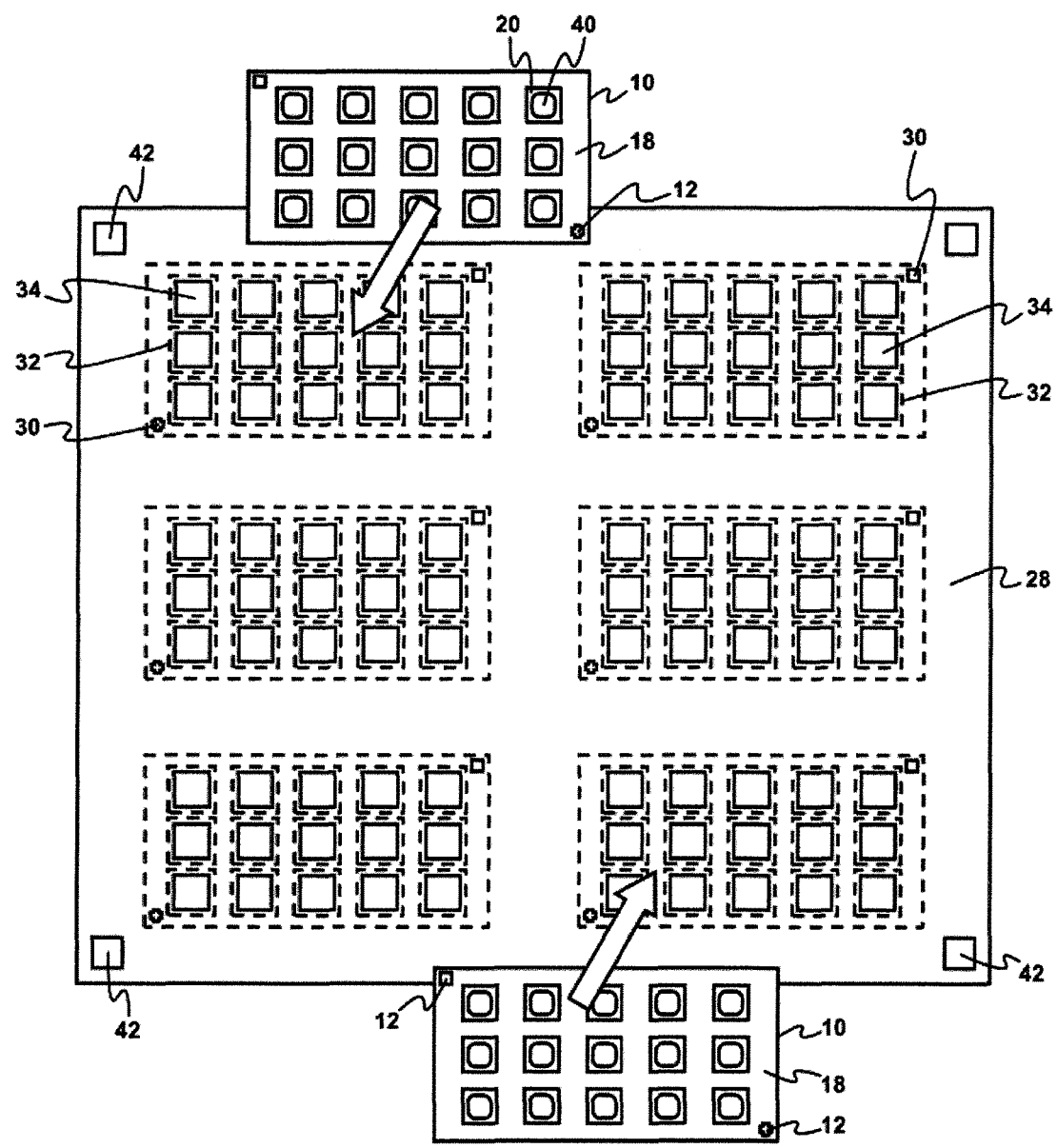
FIG. 12 is a schematic diagram illustrating an embodiment where the second carrier is sized to accommodate more than one (1) of the first carrier.

Referring now to FIG. 12, an embodiment where the second carrier 28 is sized to accommodate more than one (1) of the first carrier 10 is shown. This embodiment differs from the previous embodiment in that a plurality of first or transfer carriers 10 is being used to place the semiconductor chips 20 on the second support carrier 28. In this embodiment, the size of each transfer carrier 10 is smaller than that of the support carrier 28 and each transfer carrier 10 places a gang of semiconductor chips 20 on the support carrier 28. Advantageously, this increases the accuracy of chip placement on the support carrier 28. Further advantageously, the use of the second carrier 28 that is sized to accommodate more than one (1) of the first carrier 10 also improves semiconductor processing efficiency and helps reduce processing time. In the embodiment shown, the second carrier 28 is provided with a plurality of secondary global marks 42 for processing of the entire second or support carrier 28 and all the semiconductor chips 20 placed thereon in subsequent processing steps in addition to the primary global marks 30 that are used to align the support carrier 28 to each of the individual transfer carriers 10.

Figure 13:
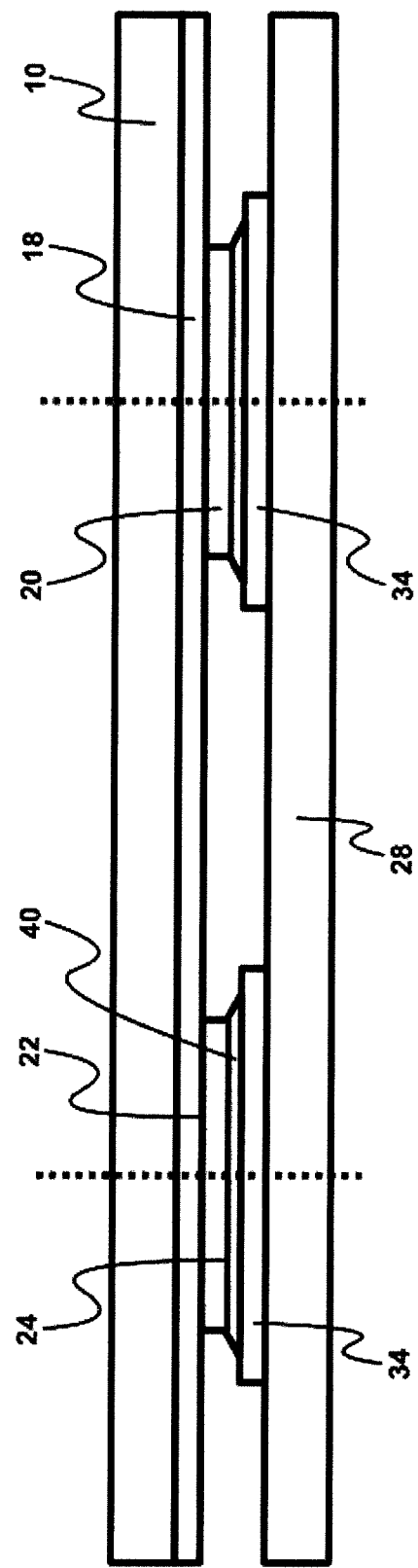
FIG. 13 is a schematic diagram illustrating the first and second carriers being brought together to attach the semiconductor chips to respective ones of the chip receiving areas on the second carrier in accordance with an embodiment of the present invention.

Referring now to FIG. 13, the first and second carriers 10 and 28 are brought together to attach the semiconductor chips 20 to respective ones of the chip receiving areas 32 on the second carrier 28 as shown. This may be by placing the transfer carrier 10 on the support carrier 28 such that the dummy surfaces 24 of the semiconductor chips 20 contact the bonding layer 40 with the centers of the semiconductor chips 20 substantially aligned with the centers of the corresponding chip pads 34. The assembly of the first and second carriers 10 and 28 is mechanically locked in position by the bonding layer 40.

When the transfer carrier 10 is placed on the support carrier 28 such that the dummy surfaces 24 of the semiconductor chips 20 contact the bonding layer 40, a portion of the second adhesive 40 is partially displaced by the mass of the transfer carrier 10. However, because the active surfaces 22 of the semiconductor chips 20 are adhered to the first adhesive 18, the displaced second adhesive 40 is prevented from flowing or getting onto the active surfaces 22 of the semiconductor chips 20 by the first adhesive 18. This is particularly advantageous when processing thin die with a thickness of between about 25 microns (μm) and about 50 μm.

In the present embodiment, the second adhesive 40 is heated to a curing temperature of the second adhesive 40 after bringing the first and second carriers 10 and 28 together. This cures the bonding layer 40 and increases the modulus and adhesive strength of the bonding layer 40 to lock the semiconductor chips 20 in a fixed or selected position relative to the first and second global marks 12 and 30. In one embodiment, the assembly of the first and second carriers 10 and 28 is heated to an elevated first temperature of about 150 degrees Celsius (° C.) which corresponds to the curing temperature of the bonding layer 40 that is being employed.

The assembly of the first and second carriers 10 and 28 may be cooled before heating the first adhesive 18 to a release temperature of the releasable adhesive material before separating the first carrier 10 from the semiconductor chips 20. This heating operation causes the first adhesive 18 to lose substantial adhesive strength and this facilitates subsequent separation of the first carrier 10 from the semiconductor chips 20. The release temperature of the releasable adhesive material is higher than the curing temperature of the second adhesive 40. In one embodiment, the assembly of the first and second carriers 10 and 28 is heated to an elevated second temperature of about 200° C. which corresponds to the release temperature of the releasable adhesive material that is used.

In other words, after the bonding layer 40 cures and increases in adhesion strength to the semiconductor chips 20, the first adhesive 18 loses adhesion strength to the semiconductor chips 20.

The two-step heating process may be performed in one (1) machine or by using two (2) machines. In the latter embodiment, the assembly of the first and second carriers 10 and 28 may be heated in a first machine before being cooled and conveyed to a second machine for the second heating operation.

Prior to curing the second adhesive 40, the bonding layer 40 may be in a paste form or a fluid state. In such an embodiment, the first adhesive 18 on the transfer carrier 10 helps prevent the semiconductor chips 20 from involuntarily shifting from a centered position due to surface tension or a buoyancy effect of the bonding layer 40 as the semiconductor chips 20 are held in place by the first adhesive 18. Thus, the relative positions of the semiconductor chips 20 remain substantially the same even after the semiconductor chips 20 are transferred onto the support carrier 28.

When the transfer carrier 10 and the support carrier 28 are made of different materials, there exists a difference in the coefficients of thermal expansion (CTEs). At elevated temperatures, the transfer carrier 10 and the support carrier 28 expand at different rates. As the first adhesive 18 has significantly stronger adhesive strength than the uncured bonding layer 40, the semiconductor chips 20 tend to follow the transfer carrier 10 during expansion and thus it is preferable that the coefficient of thermal expansion (CTE) of the transfer carrier 10 be smaller than that of the support carrier 28. Accordingly, the first carrier 10 in the present embodiment may have a same or a smaller coefficient of thermal expansion (CTE) than the second carrier 28. For example, the transfer carrier 10 may be made of glass with a CTE of about 3 parts per million per degree Celsius (ppm/° C.) and the support carrier 28 may be made of steel with a CTE of about 11 ppm/° C. in one exemplary embodiment. In a preferred embodiment, both the first and second carriers 10 and 28 are made of the same material so that the expansion rates are the same when heated.

Figure 14:
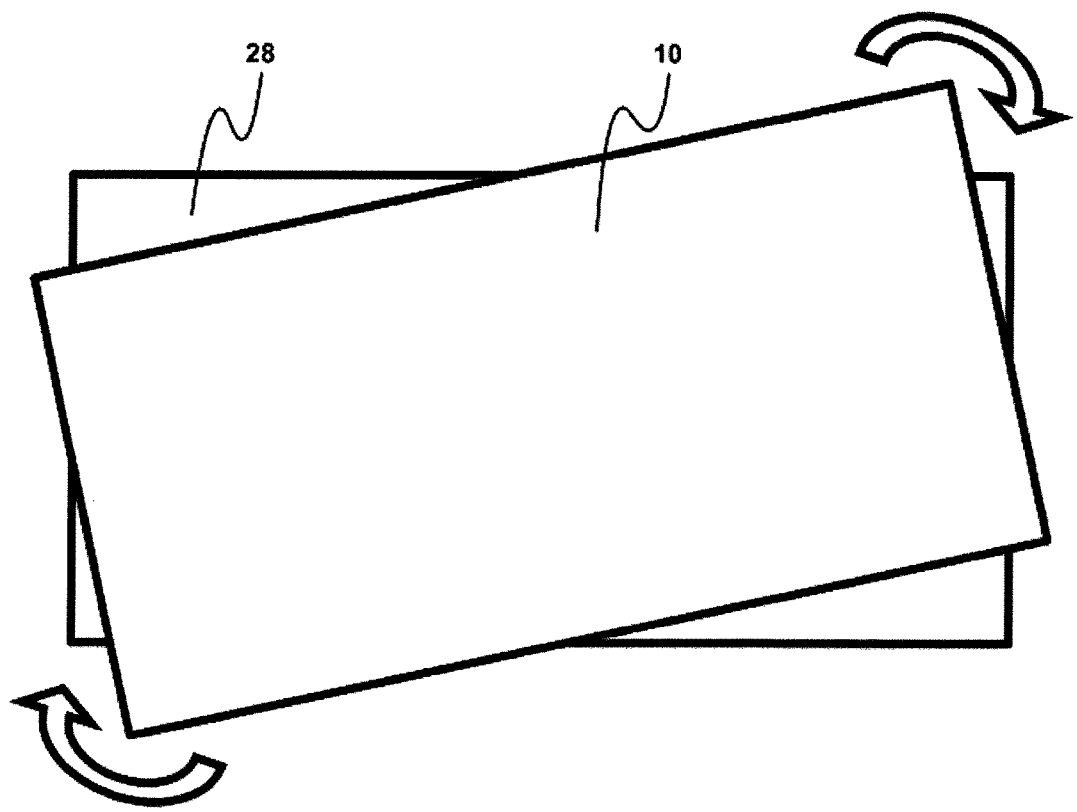
FIG. 14 is a schematic diagram illustrating application of a shear force to separate the first carrier from the semiconductor chips in accordance with an embodiment of the present invention.
Figure 15:
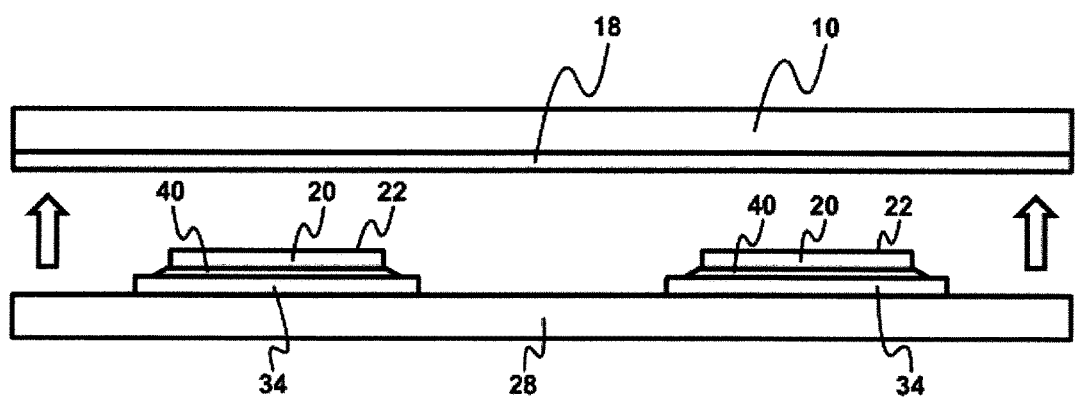
FIG. 15 is a schematic diagram illustrating separation of the first carrier from the semiconductor chips in accordance with an embodiment of the present invention.

Referring now to FIGS. 14 and 15, separation of the first carrier 10 from the semiconductor chips 20 is shown. As can be seen from FIGS. 14 and 15, the step of separating the first carrier 10 from the semiconductor chips 20 involves applying a shear force to the first carrier 10 before pulling the first carrier 10 away from the semiconductor chips 20. More particularly, the action of separation involves shearing (angular and lateral displacement between the transfer and support carriers 10 and 28) followed by pulling (vertical displacement between the transfer and support carriers 10 and 28) to minimize damage and unnecessary movement of the semiconductor chips 20. The semiconductor chips 20 are held securely in place on the chip pads 34 by the bonding layer 40.

In the present embodiment, the transfer carrier 10 is separated from the support carrier 28 while the assembly of the first and second carriers 10 and 28 is kept at the second elevated temperature.

Figure 16:
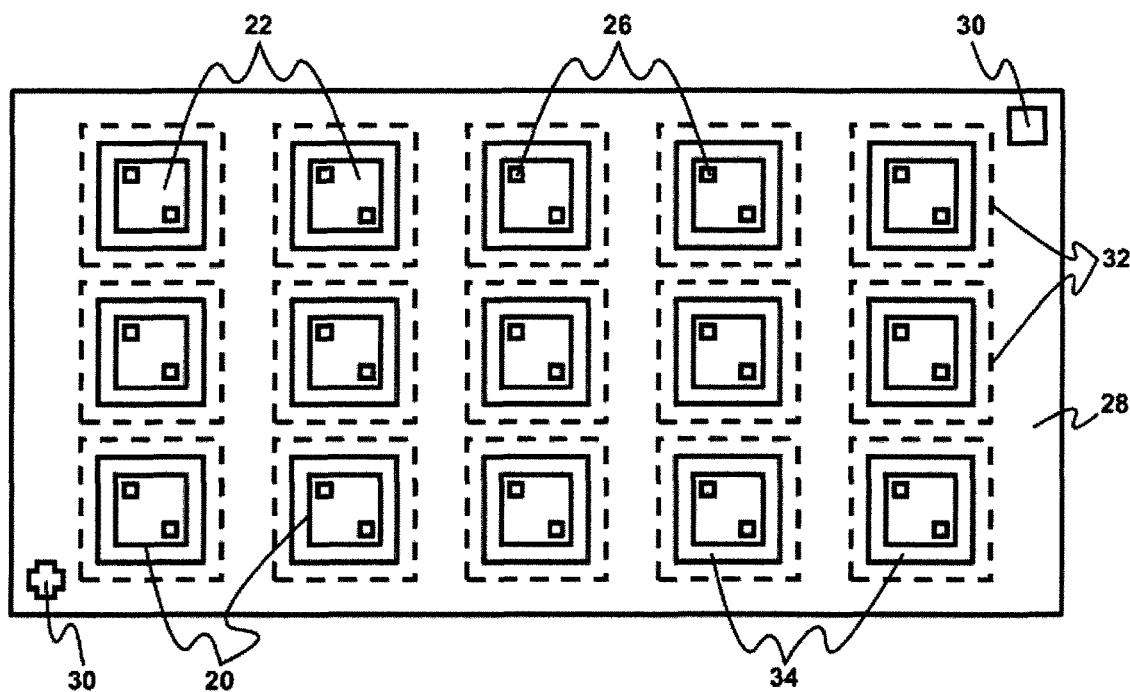
FIG. 16 is a schematic diagram illustrating attachment of the semiconductor chips to the second carrier of FIG. 5.

Referring now to FIG. 16, when the transfer carrier 10 is separated from the support carrier 28, the first adhesive 18 is separated from the active surfaces 22 of the semiconductor chips 20. The active surfaces 22 of the semiconductor chips 20 are thus exposed and face away from the support carrier 28. Consequently, the terminal pads and the chip marks 26 of the semiconductor chips 20 are also exposed.

A cleaning operation may then be performed on the active surfaces 22 of the semiconductor chips 20 to remove residue from the first adhesive 18. This may be by plasma or chemical rinsing.

In one embodiment, a scanning operation may be performed at this juncture to obtain positional data of the terminal pads on each of the semiconductor chips 20 for subsequent processing steps. This may be by using an optical vision system. More particularly, a detector or camera of the optical vision system may identify a plurality of features to be captured (for example, prominent shapes, color contrast or a combination of both) and the corresponding positional data of the features may be recorded for use in subsequent processing steps.

In the manner described above, the semiconductor chips 20 may be simultaneously transferred from the transfer carrier 10 to the support carrier 28 with each of the semiconductor chips 20 accurately placed and substantially aligned with corresponding ones of the chip pads 34 and a center of each of the semiconductor chips 20 substantially aligned with a center of corresponding ones of the chip pads 34. The semiconductor chips 20 are thus positioned at a fixed or selected position relative to the second global marks 30 on the support carrier 28 and the position of each of the semiconductor chips 20 may be calculated and determined by the second global marks 30. Accordingly, because the position of each of the semiconductor chips 20 may be calculated and determined by the second global marks 30 and the locations of the terminal pads on each semiconductor chip 20 is at a fixed or selected position relative to the corresponding chip center, the locations of the terminal pads on each semiconductor chip 20 may also be calculated and determined from the second global marks 30.

Figure 17:
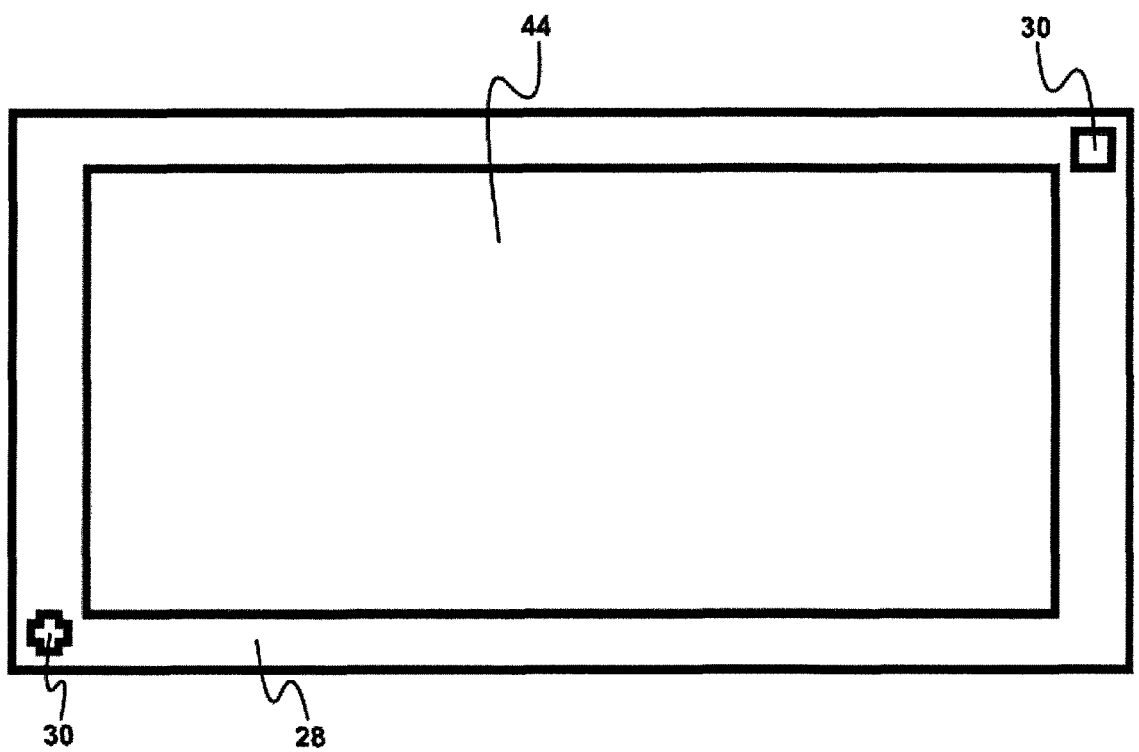
FIG. 17 is a schematic side view showing a dielectric layer formed on the second carrier of FIG. 16 in accordance with an embodiment of the present invention.

Referring now to FIG. 17, a dielectric layer 44 is formed on the second carrier 28 as shown, the dielectric layer 44 encapsulating the semiconductor chips 20. In the embodiment shown, the dielectric layer 44 only encapsulates the semiconductor chips 20 and the chip pads 34 without covering the second global marks 30.

The dielectric layer 44 may be formed on the second carrier 28 by process of molding, lamination or printing. In one embodiment, the dielectric layer 44 is formed using an epoxy compound in the form of a film sheet or paste. The thickness of the dielectric layer 44 may be thinned by grinding or polishing without exposing the semiconductor chips 20.

In one embodiment, a scanning operation may be performed at this juncture to obtain positional data of the terminal pads on each of the semiconductor chips 20 for subsequent processing steps. This may be by exposing the dielectric layer 44 encapsulating the semiconductor chips 20 to electromagnetic radiation (for example, X-rays, infrared rays or ultraviolet rays) that allows a detector or camera of a vision system to capture and record the positional data of the terminal pads on each of the semiconductor chips 20 for use in subsequent processing steps.

Figure 18:
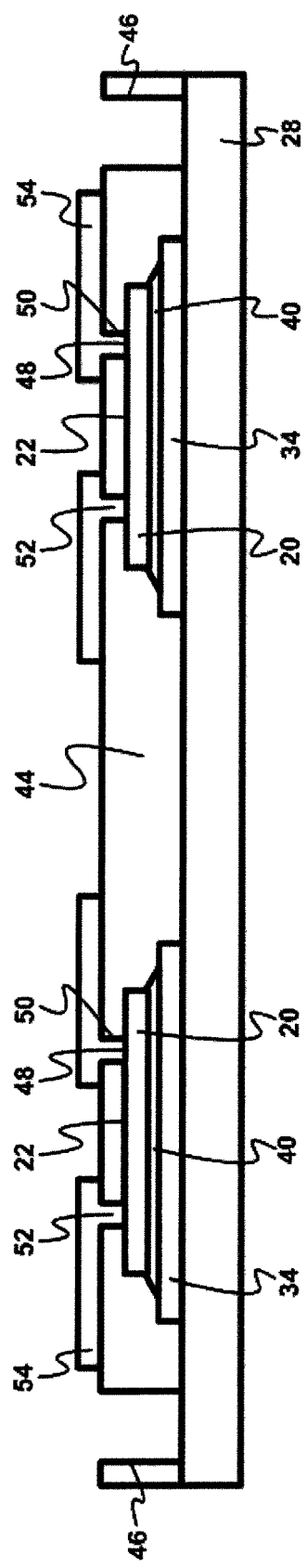
FIG. 18 is a schematic top plan view showing a dielectric layer formed on the second carrier of FIG. 16 in accordance with another embodiment of the present invention.

Referring now to FIG. 18, another embodiment of the dielectric layer 44 disposed on the second carrier 28 is shown. In this embodiment, the second global marks 30 were initially covered and encapsulated by the dielectric layer 44. Accordingly, a plurality of first openings 46 is formed in the dielectric layer 44 to expose respective ones of the second global marks 30.

The second global marks 30 on the second carrier 28 may be exposed by, for example laser drilling. The size of the mark openings 46 may be larger than the size of the second global marks 30 to ensure full exposure of the second global marks 30 in the mark openings 46.

In the present embodiment, a position of a plurality of terminal pads 48 on each of the semiconductor chips 20 is first determined based on a position of the second global marks 30 and a plurality of second openings 50 is then formed in the dielectric layer 44 to expose respective ones of the terminal pads 48. Advantageously, the described semiconductor processing method of transferring the semiconductor chips 20 from the transfer carrier 10 to the support carrier 28 allows the positions of the terminal pads 48 to be accurately calculated and determined from the second global marks 30 on the support carrier 28. Accuracy in forming the second openings 50 is critical as any misalignment between the second openings 50 and the corresponding terminal pads 48 may damage sensitive circuitry of the semiconductor chips 20. Thus, the ability to calculate and determine precise locations of the terminal pads 48 on the semiconductor chips 20 based on the position of the second global marks 30 provides a significant advantage.

Formation of the second openings 50 may be by laser drilling or firing, for example. Laser firing may be performed using a laser direct imaging (LDI) system with a vision and controller system to enable creation of accurate patterns. More particularly, the vision capabilities help locate the second global marks 30 and the controller system helps calculate the relative positions of the semiconductor chips 20 and the corresponding terminal pads 48. The laser system then moves to precise locations above the terminal pads 48 to create the second openings 50. In one embodiment, the positional data of the terminal pads 48 obtained from an earlier scanning operation may be employed to locate the terminal pads 48 for the formation of the second openings 50.

In the embodiment shown, a plurality of vias 52 is formed in the second openings 50 of the dielectric layer 44 and a plurality of conductive traces 54 is formed on a surface of the dielectric layer 44. The vias 52 connect the terminal pads 48 on the active surfaces 22 of the semiconductor chips 20 to the conductive traces 54.

The vias 52 and conductive traces 54 may be formed by a semi-additive electroplating process. More particularly, a metal seed layer may be deposited on the surface of the dielectric layer 44 and the sidewalls of the vias 52 by an electroless deposition process, followed by disposing a photoresist layer on the dielectric layer 44. The photoresist layer may then be patterned using LDI or mask exposure. Thereafter, the vias 52 may be formed in the second openings 50 and the conductive traces 54 may be formed on the seed layer with a conductive material such as, for example, copper. Finally, any exposed portions of the seed layer are removed.

In the step of patterning the photoresist layer, the second global marks 30 are again used as reference features to calculate and determine the relative position of the patterns with respect to the semiconductor chips 20. In the embodiment where LDI is used, the vision and controller system locates the second global marks 30 and calculates the positions of the semiconductor chips 20 by taking reference from the second global marks 30. In the embodiment where mask exposure is used, corresponding marks on the mask are aligned with the second global marks 30 on the support carrier 28. The patterns on the mask are formed on the photoresist layer and correspond in position to the semiconductor chips 20.

The global marks 30 of the support carrier 28 are also used in the subsequent steps of forming a semiconductor package to accurately calculate and determine the positions of the semiconductor chips 20 and their corresponding terminal pads 48. As the general method of using the global marks 30 is similar to that described above, further description is not required for a complete understanding of the present invention.

Subsequent to the encapsulation step, the second carrier 28 may be removed by chemical etching or mechanical separation and the semiconductor chips 20 may be separated by laser or mechanical cutting or dicing through the dielectric layer 44 to obtain a plurality of semiconductor package units.

Figure 19:
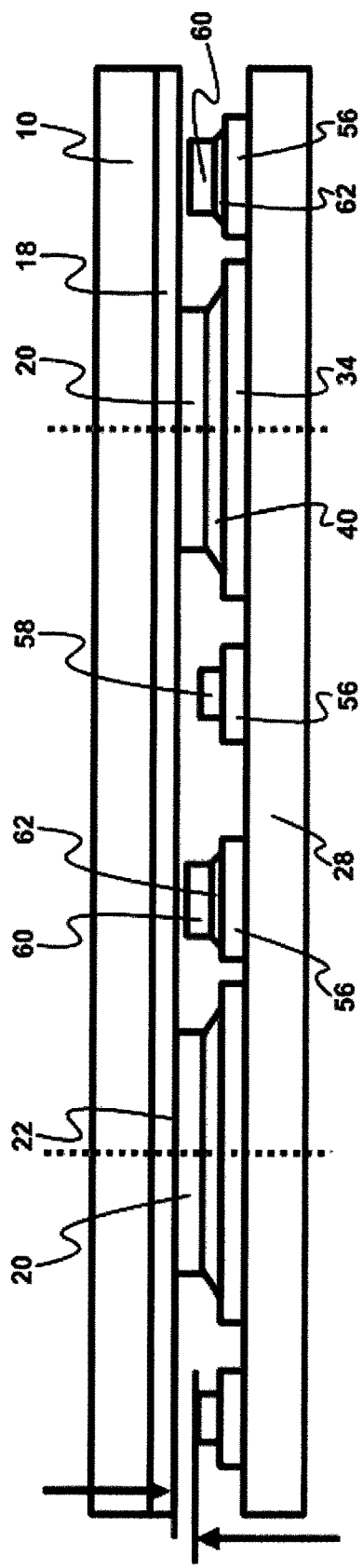
FIG. 19 is a schematic diagram illustrating a semiconductor processing step in accordance with another embodiment of the present invention.

Referring now to FIG. 19, another embodiment of the assembly of the first and second carriers 10 and 28 is shown. The present embodiment differs from the earlier embodiments in that a plurality of component pads 56 is provided on the second carrier 28. Each of the component pads 56 may be provided at a fixed or specified position relative to the second global marks 30 and also relative to the chip pads 34 and the other component pads 56. The second global marks 30 may be used to calculate and determine a position of the component pads 56. The components pads 56 may be formed together with the chip pads 34 on the second carrier 28.

A plurality of structural features 58, a plurality of passive components 60 or a combination thereof may be formed on or attached to respective ones of the component pads 56 on the second carrier 28. In alternative embodiments, the component pads 56 may be omitted and the structural features 58 and/or the passive components 60 may be directly formed on or attached to the second carrier 28 or the chip pads 34. The structural features 58 may be interconnect or pillar columns for vertical connections, wall structures for radio frequency (RF) shielding or patterned structures for enhancing the structural integrity of the resultant semiconductor packages. The structural features 58 may be pre-formed on the support carrier 28. The structural features 58 may be pre-formed by electroplating, etching or attaching external parts on the second carrier 28. Photolithography may be used in combination with electroplating or etching to form various patterns or configurations of the structural features 58 on the second carrier 28. Alternatively, external parts may be attached onto the second carrier 28 by conventional surface mounting processes.

The passive component 60 may be a capacitor, a resistor, a diode, an inductor or an integrated passive device (IPD). A bonding layer 62 of, for example, epoxy or solder may be dispensed onto the component pad 56 prior to placement of the passive components 60 on the component pads 56. Alternatively, the passive components 60 may be provided with a preformed bonding layer on a plurality of electrodes of the passive components 60 for attachment to the component pads 56. The support carrier 28 may be subjected to a heat treatment after being populated with the passive components 60 to ensure complete bonding.

To avoid interfering with the assembly of the first and second carriers 10 and 28, the upper surfaces of the structural features 58 and the passive components 60 are lower than the active surfaces 22 of the semiconductor chips 20. If the chip pads 34 and the component pads 56 are of the same thickness, the thickness of the semiconductor chips 20 must be substantially equal to or greater than the thickness of the structural features 58 and the passive components 60. The thickness of the semiconductor chips 20 may be specified or controlled by grinding or polishing the semiconductor chips 20.

Accordingly, in the embodiment shown, the height of the structural features 58 and the passive components 60 is less than a thickness of the semiconductor chips 20. Consequently, during transfer of the semiconductor chips 20 from the transfer carrier 10 to the support carrier 28, the structural features 58 and the passive components 60 do not come in contact with the first adhesive 18 and also do not affect contact of the semiconductor chips 20 with the chip pads 34.

Figure 20:
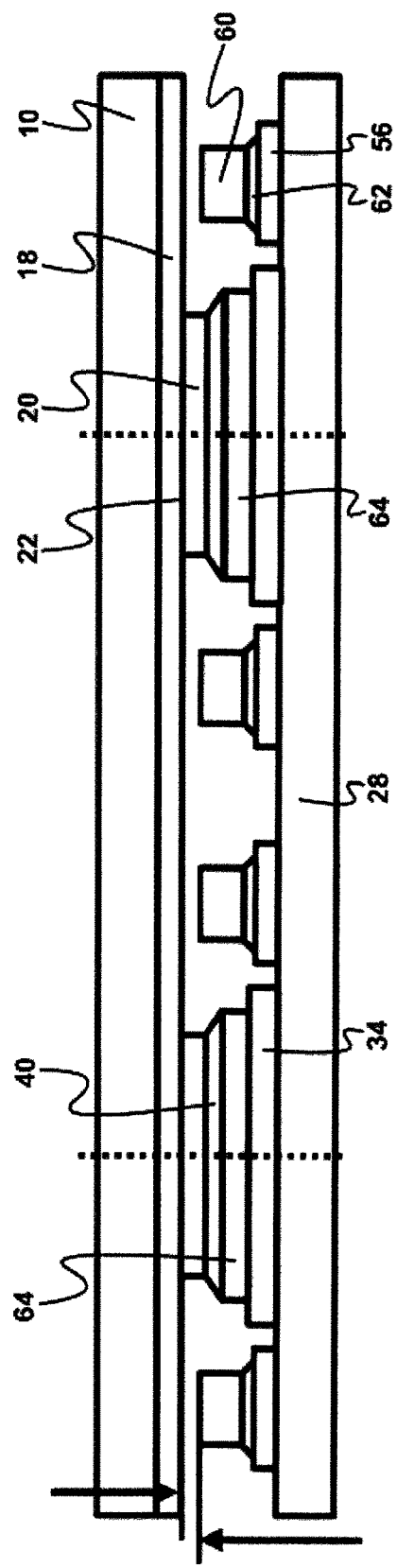
FIG. 20 is a schematic diagram illustrating a semiconductor processing step in accordance with yet another embodiment of the present invention.

Referring now to FIG. 20, yet another embodiment of the assembly of the first and second carriers 10 and 28 is shown. In this embodiment, the thickness of the semiconductor chips 20 is less than the thickness of the passive components 60. Accordingly, a spacer 64 is disposed between each of the semiconductor chips 20 and corresponding ones of the chip pads 34 to increase a height of the active surfaces 22 of the semiconductor chips 20. In an alternative embodiment, the height of the active surfaces 22 of the semiconductor chips 20 may be raised by electroplating the chip pads 34 to a greater thickness.

Figure 21:
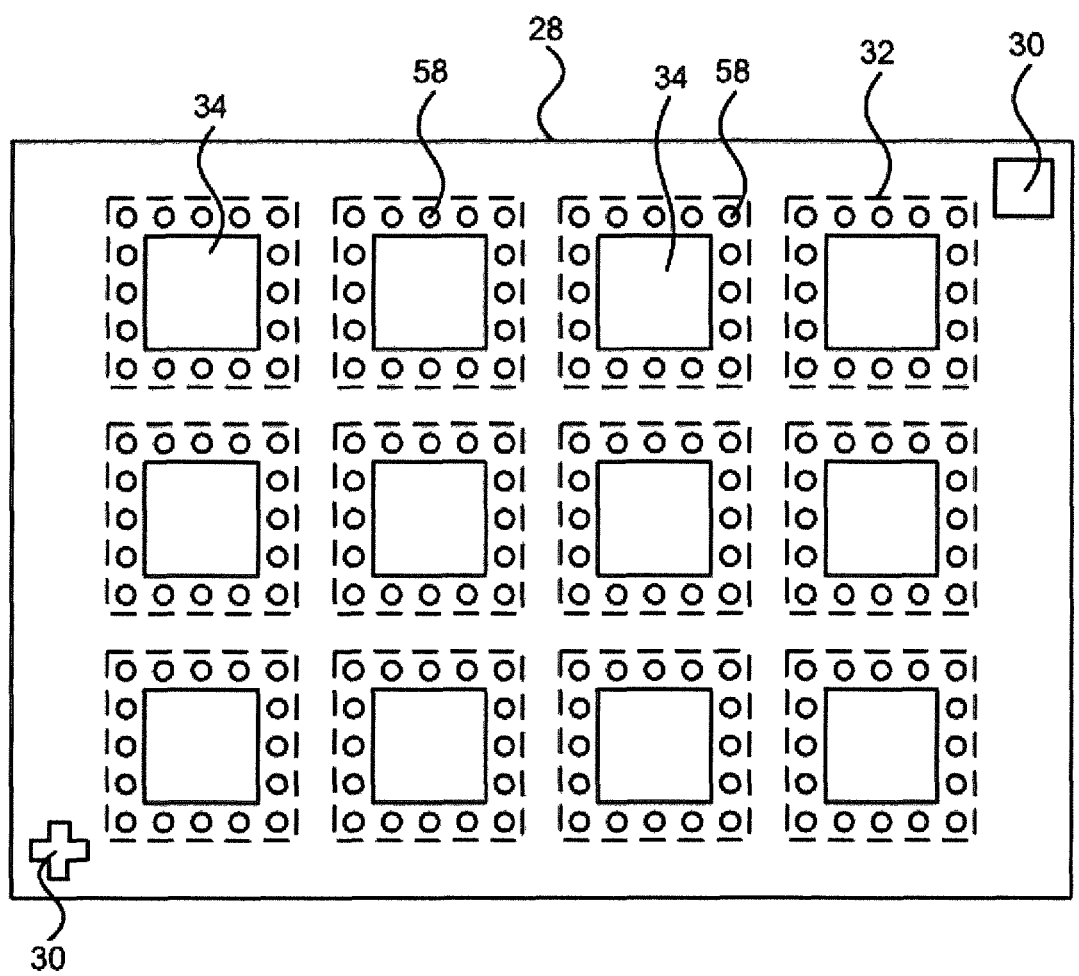
FIGS. 21 and 22 are schematic top plan views of the second carrier in accordance with other embodiments of the present invention.
Figure 22:
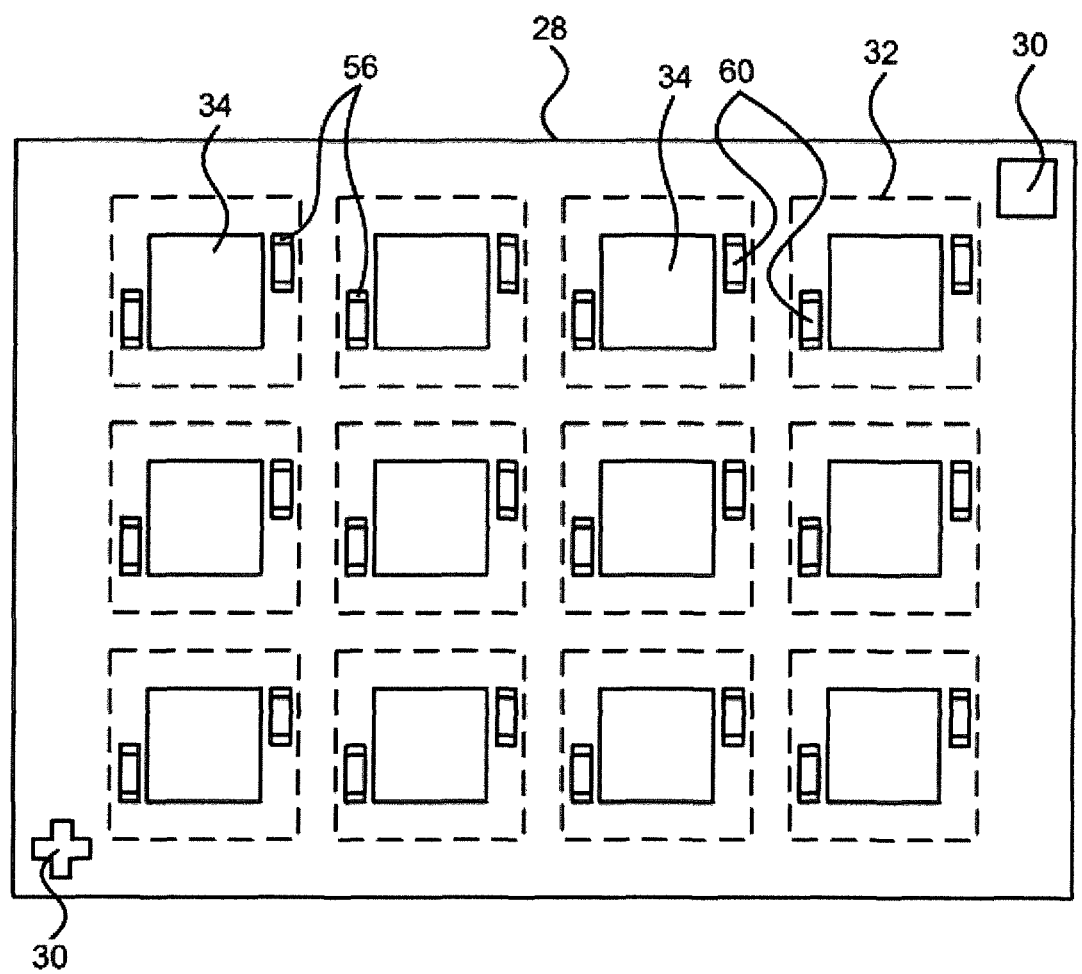

Exemplary layouts of the structural features 58 and the passive components 60 on the second carrier 28 are shown in FIGS. 21 and 22 described below.

Referring now to FIG. 21, the structural features 58 are provided on the second carrier 28 around the chip pads 34 in the embodiment shown.

Referring now to FIG. 22, the passive components 60 in the present embodiment are disposed on or attached to respective ones of the component pads 56 on the second carrier 28. The passive components 60 may be disposed on or attached to the components pads 56 by component placement using conventional surface mounting processes.

Figure 23:
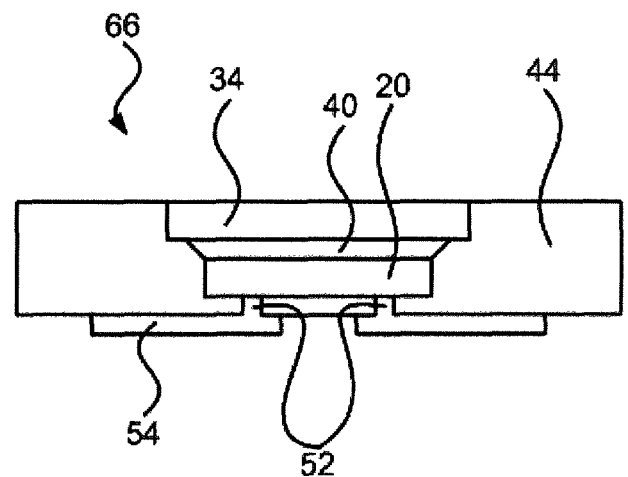
FIGS. 23 and 26 are enlarged cross-sectional views of semiconductor packages formed in accordance with embodiments of the present invention.
Figure 26:
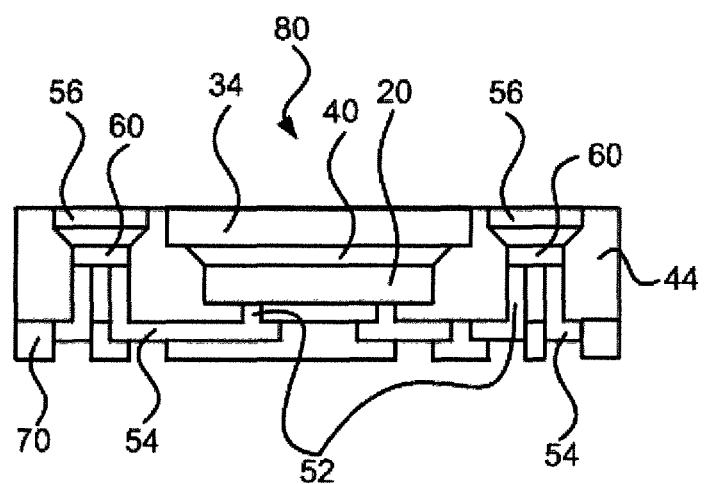

Exemplary semiconductor packages formed with the semiconductor processing method are shown in FIGS. 23 and 26 described below.

Referring now to FIG. 23, a semiconductor package 66 is shown. The semiconductor package 66 includes a semiconductor chip 20 attached to a chip pad 34 by a second adhesive 40. The semiconductor chip 20 is encapsulated by a first dielectric layer 44. A plurality of first vias 52 formed through the first dielectric layer 44 connects the semiconductor chip 20 to a plurality of first conductive traces 54.

Figure 24:
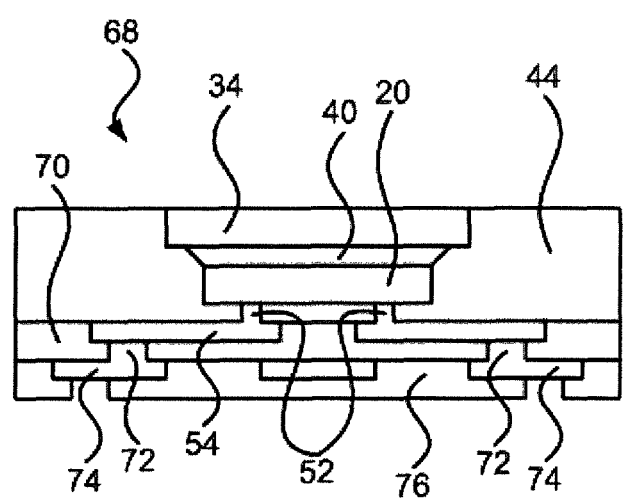

Referring now to FIG. 24, a semiconductor package 68 is shown. The semiconductor package 68 differs from the previous embodiment in that the first conductive traces 54 are encapsulated by a second dielectric layer 70 and a plurality of second vias 72 formed through the second dielectric layer 70 connects the first conductive traces 54 to a plurality of second conductive traces 74. The second conductive traces 74 are encapsulated by a third dielectric layer 76. In this manner, multiple layers of conductive traces may be sequentially added using conventional layer build-up processes to provide higher routing density and complexity. The second and third dielectric layers 70 and 76 may be, for example, an epoxy molding compound or film, a woven fiberglass laminate or a soldermask.

Figure 25:
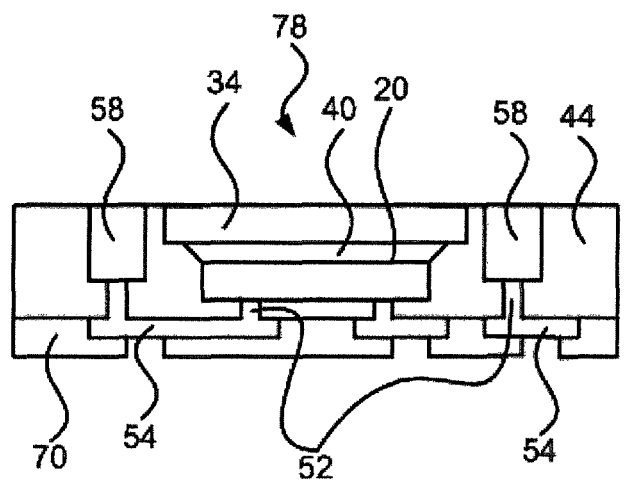

Referring now to FIG. 25, a semiconductor package 78 is shown. The semiconductor package 78 differs from the previous embodiments in that the semiconductor package 78 includes a plurality of structural features 58. The structural features 58 are also encapsulated by the first dielectric layer 44 and are electrically connected to the first conductive traces 54 by the first vias 52. The first conductive traces 54 are encapsulated by a second dielectric layer 70. In the present embodiment, the structural features 58 are interconnect columns that provide an electrical connection path from one surface of the semiconductor package 78 to an opposite surface of the semiconductor package 78. Advantageously, this allows another semiconductor package to be stacked on the semiconductor package 78 to form a stacked semiconductor package.

Referring now to FIG. 26, a semiconductor package 80 is shown. The semiconductor package 80 differs from the previous embodiments in that the semiconductor package 78 includes a plurality of passive components 60 disposed on or attached to a plurality of component pads 56. The passive components 60 are also encapsulated by the first dielectric layer 44 and are electrically connected to the first conductive traces 54 by the first vias 52 and to the semiconductor chip 20 by the first conductive traces 54. The first conductive traces 54 are encapsulated by a second dielectric layer 70. As is evident from the foregoing discussion, the present invention provides a semiconductor processing method that allows for simultaneous processing of a plurality of semiconductor chips. Advantageously, this increases processing efficiency and reduces processing time and cost. Additionally, through the provision of global marks as position indicators during semiconductor processing, processing accuracy and hence product reliability is also improved.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the scope of the present invention as defined by the appended claims.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:

1. A semiconductor processing method, comprising:
providing a first carrier, wherein the first carrier is provided with a plurality of first global marks:
providing the first carrier with a plurality of first unit marks, the first unit marks defining a plurality of chip placement positions;
providing a first adhesive on the first carrier;
aligning a plurality of chip marks on each of a plurality of semiconductor chips with corresponding ones of the first unit marks wherein the chip marks are provided on an active surface of the semiconductor chips;
placing respective ones of the semiconductor chips on the first adhesive;
providing a second carrier, wherein the second carrier is provided with a plurality of chip receiving areas and a plurality of second global marks;
aligning the first global marks with corresponding ones of the second global marks; bringing the first and second carriers together to attach the semiconductor chips to respective ones of the chip receiving areas on the second carrier; and
separating the first carrier from the semiconductor chips.

2. The method of claim 1, wherein each of the first global marks has a different shape and each of the second global marks has a same shape as a corresponding one of the first global marks.

3. The method of claim 1, wherein the step of providing the first carrier with the first unit marks comprises determining a position of the first unit marks based on a position of the first global marks.

4. The method of claim 1, wherein the chip receiving areas comprise a plurality of chip pads provided on the second carrier.

5. The method of claim 4, further comprising forming a plurality of second unit marks on one of a surface of the second carrier adjacent respective ones of the chip pads and the chip pads themselves.

6. The method of claim 5, wherein the step of forming the second unit marks comprises determining a position of the second unit marks based on a position of the second global marks.

7. The method of claim 1, further comprising providing a plurality of component pads on the second carrier.

8. The method of claim 7, further comprising attaching a plurality of structural features, a plurality of passive components or a combination thereof to respective ones of the component pads on the second carrier.

9. The method of claim 1, further comprising disposing a second adhesive on one of each of the semiconductor chips and each of the chip receiving areas.

10. The method of claim 9, further comprising heating the second adhesive to a curing temperature of the second adhesive after bringing the first and second carriers together.

11. The method of claim 1, wherein the first adhesive comprises a releasable adhesive material.

12. The method of claim 11, further comprising heating the first adhesive to a release temperature of the releasable adhesive material before separating the first carrier from the semiconductor chips.

13. The method of claim 1, wherein the step of separating the first carrier from the semiconductor chips comprises applying a shear force to the first carrier before pulling the first carrier away from the semiconductor chips.

14. The method of claim 1, further comprising providing the second carrier with a plurality of secondary global marks.

15. The method of claim 1, wherein the second carrier is sized to accommodate more than one of the first carrier.

16. The method of claim 1, wherein the first carrier has a same or a smaller coefficient of thermal expansion than the second carrier.

17. The method of claim 1, further comprising forming a dielectric layer on the second carrier, the dielectric layer encapsulating the semiconductor chips.

18. The method of claim 17, further comprising:
determining a position of a plurality of terminal pads on each of the semiconductor chips based on a position of the second global marks; and
forming a plurality of openings in the dielectric layer to expose respective ones of the terminal pads.

19. The method of claim 17, further comprising forming a plurality of openings in the dielectric layer to expose respective ones of the second global marks.

20. The method of claim 1, further comprising performing a scanning operation to obtain positional data of a plurality of terminal pads on each of the semiconductor chips.

21. A semiconductor processing method, comprising:
providing a first carrier, wherein the first carrier is provided with a plurality of first global marks;
providing a first adhesive on the first carrier;
placing a plurality of semiconductor chips on the first adhesive;
providing a second carrier, wherein the second carrier is provided with a plurality of chip receiving areas and a plurality of second global marks, and wherein the chip receiving areas comprise a plurality of chip pads provided on the second carrier;
forming a plurality of second unit marks on one of a surface of the second carrier adjacent respective ones of the chip pads and the chip pads themselves;
aligning the first global marks with corresponding ones of the second global marks;
bringing the first and second carriers together to attach the semiconductor chips to respective ones of the chip receiving areas on the second carrier; and
separating the first carrier from the semiconductor chips.

22. The method of claim 21, wherein each of the first global marks has a different shape and each of the second global marks has a same shape as a corresponding one of the first global marks.

23. The method of claim 21, further comprising providing the first carrier with a plurality of first unit marks, the first unit marks defining a plurality of chip placement positions, wherein the step of providing the first carrier with the first unit marks comprises determining a position of the first unit marks based on a position of the first global marks.

24. The method of claim 21, wherein the step of forming the second unit marks comprises determining a position of the second unit marks based on a position of the second global marks.

25. The method of claim 21, further comprising providing a plurality of component pads on the second carrier.

26. The method of claim 25, further comprising attaching a plurality of structural features, a plurality of passive components or a combination thereof to respective ones of the component pads on the second carrier.

27. The method of claim 25, further comprising disposing a second adhesive on one of each of the semiconductor chips and each of the chip receiving areas.

28. The method of claim 27, further comprising heating the second adhesive to a curing temperature of the second adhesive after bringing the first and second carriers together.

29. The method of claim 21, wherein the first adhesive comprises a releasable adhesive material.

30. The method of claim 29, further comprising heating the first adhesive to a release temperature of the releasable adhesive material before separating the first carrier from the semiconductor chips.

31. The method of claim 21, wherein the step of separating the first carrier from the semiconductor chips comprises applying a shear force to the first carrier before pulling the first carrier away from the semiconductor chips.

32. The method of claim 21, further comprising providing the second carrier with a plurality of secondary global marks.

33. The method of claim 21, wherein the second carrier is sized to accommodate more than one of the first carrier.

34. The method of claim 21, wherein the first carrier has a same or a smaller coefficient of thermal expansion than the second carrier.

35. The method of claim 21, further comprising forming a dielectric layer on the second carrier, the dielectric layer encapsulating the semiconductor chips.

36. The method of claim 35, further comprising:
determining a position of a plurality of terminal pads on each of the semiconductor chips based on a position of the second global marks; and
forming a plurality of openings in the dielectric layer to expose respective ones of the terminal pads.

37. The method of claim 35, further comprising forming a plurality of openings in the dielectric layer to expose respective ones of the second global marks.

38. The method of claim 21, further comprising performing a scanning operation to obtain positional data of a plurality of terminal pads on each of the semiconductor chips.

39. A semiconductor processing method, comprising:
providing a first carrier, wherein the first carrier is provided with a plurality of first global marks;
providing a first adhesive on the first carrier;
placing a plurality of semiconductor chips on the first adhesive;
providing a second carrier, wherein the second carrier is provided with a plurality of chip receiving areas and a plurality of second global marks;
forming a dielectric layer on the second carrier, the dielectric layer encapsulating the semiconductor chips;
determining a position of a plurality of terminal pads on each of the semiconductor chips based on a position of the second global marks;
forming a plurality of openings in the dielectric layer to expose respective ones of the terminal pads;
aligning the first global marks with corresponding ones of the second global marks;
bringing the first and second carriers together to attach the semiconductor chips to respective ones of the chip receiving areas on the second carrier; and
separating the first carrier from the semiconductor chips.

40. The method of claim 39, wherein each of the first global marks has a different shape and each of the second global marks has a same shape as a corresponding one of the first global marks.

41. The method of claim 39, further comprising providing the first carrier with a plurality of first unit marks, the first unit marks defining a plurality of chip placement positions, wherein the step of providing the first carrier with the first unit marks comprises determining a position of the first unit marks based on a position of the first global marks.

42. The method of claim 39, wherein the chip receiving areas comprise a plurality of chip pads provided on the second carrier, wherein a plurality of second unit marks is formed on one of a surface of the second carrier adjacent respective ones of the chip pads and the chip pads themselves, and wherein a position of the second unit marks is determined based on a position of the second global marks.

43. The method of claim 39, further comprising providing a plurality of component pads on the second carrier.

44. The method of claim 43, further comprising attaching a plurality of structural features, a plurality of passive components or a combination thereof to respective ones of the component pads on the second carrier.

45. The method of claim 39, further comprising disposing a second adhesive on one of each of the semiconductor chips and each of the chip receiving areas.

46. The method of claim 45, further comprising heating the second adhesive to a curing temperature of the second adhesive after bringing the first and second carriers together.

47. The method of claim 39, wherein the first adhesive comprises a releasable adhesive material.

48. The method of claim 47, further comprising heating the first adhesive to a release temperature of the releasable adhesive material before separating the first carrier from the semiconductor chips.

49. The method of claim 39, wherein the step of separating the first carrier from the semiconductor chips comprises applying a shear force to the first carrier before pulling the first carrier away from the semiconductor chips.

50. The method of claim 39, further comprising providing the second carrier with a plurality of secondary global marks.

51. The method of claim 39, wherein the second carrier is sized to accommodate more than one of the first carrier.

52. The method of claim 39, wherein the first carrier has a same or a smaller coefficient of thermal expansion than the second carrier.

53. The method of claim 39, further comprising forming a plurality of openings in the dielectric layer to expose respective ones of the second global marks.

54. The method of claim 39, further comprising performing a scanning operation to obtain positional data of a plurality of terminal pads on each of the semiconductor chips.

55. A semiconductor processing method, comprising:
providing a first carrier, wherein the first carrier is provided with a plurality of first global marks;
providing a first adhesive on the first carrier;
placing a plurality of semiconductor chips on the first adhesive;
providing a second carrier, wherein the second carrier is provided with a plurality of chip receiving areas and a plurality of second global marks;
forming a dielectric layer on the second carrier, the dielectric layer encapsulating the semiconductor chips;
forming a plurality of openings in the dielectric layer to expose respective ones of the second global marks;
aligning the first global marks with corresponding ones of the second global marks;
bringing the first and second carriers together to attach the semiconductor chips to respective ones of the chip receiving areas on the second carrier; and
separating the first carrier from the semiconductor chips.

56. The method of claim 55, wherein each of the first global marks has a different shape and each of the second global marks has a same shape as a corresponding one of the first global marks.

57. The method of claim 55, further comprising providing the first carrier with a plurality of first unit marks, the first unit marks defining a plurality of chip placement positions, wherein the step of providing the first carrier with the first unit marks comprises determining a position of the first unit marks based on a position of the first global marks.

58. The method of claim 55, wherein the chip receiving areas comprise a plurality of chip pads provided on the second carrier, wherein a plurality of second unit marks is formed on one of a surface of the second carrier adjacent respective ones of the chip pads and the chip pads themselves, and wherein a position of the second unit marks is determined based on a position of the second global marks.

59. The method of claim 55, further comprising providing a plurality of component pads on the second carrier.

60. The method of claim 59, further comprising attaching a plurality of structural features, a plurality of passive components or a combination thereof to respective ones of the component pads on the second carrier.

61. The method of claim 55, further comprising disposing a second adhesive on one of each of the semiconductor chips and each of the chip receiving areas.

62. The method of claim 61, further comprising heating the second adhesive to a curing temperature of the second adhesive after bringing the first and second carriers together.

63. The method of claim 55, wherein the first adhesive comprises a releasable adhesive material.

64. The method of claim 63, further comprising heating the first adhesive to a release temperature of the releasable adhesive material before separating the first carrier from the semiconductor chips.

65. The method of claim 58, wherein the step of separating the first carrier from the semiconductor chips comprises applying a shear force to the first carrier before pulling the first carrier away from the semiconductor chips.

66. The method of claim 58, further comprising providing the second carrier with a plurality of secondary global marks.

67. The method of claim 58, wherein the second carrier is sized to accommodate more than one of the first carrier.

68. The method of claim 58, wherein the first carrier has a same or a smaller coefficient of thermal expansion than the second carrier.

69. The method of claim 58, further comprising performing a scanning operation to obtain positional data of a plurality of terminal pads on each of the semiconductor chips.

* * * * *

UNITED STATES PATENT AND TRADEMARK OFFICE
CERTIFICATE OF CORRECTION

PATENT NO. : 10,504,850 B2  
APPLICATION NO. : 15/752728  
DATED : December 10, 2019  
INVENTOR(S) : Yi Xin Chew Page 1 of 1

It is certified that error appears in the above-identified patent and that said Letters Patent is hereby corrected as shown below:

In the Claims

In Column 15, Line 47, delete "claim 25" and insert --claim 21--, therefor.
In Column 18, Line 33, delete "claim 58" and insert --claim 55--, therefor.
In Column 18, Line 37, delete "claim 58" and insert --claim 55--, therefor.
In Column 18, Line 40, delete "claim 58" and insert --claim 55--, therefor.
In Column 18, Line 42, delete "claim 58" and insert --claim 55--, therefor.
In Column 18, Line 45, delete "claim 58" and insert --claim 55--, therefor.

Signed and Sealed this  
Thirty-first Day of March, 2020

Andrei Iancu  
*Director of the United States Patent and Trademark Office*